(12) United States Patent
Dobashi

(10) Patent No.: US 7,135,666 B2
(45) Date of Patent: Nov. 14, 2006

(54) IMAGE PICK-UP DEVICE HAVING WELL STRUCTURE AND IMAGE PICK-UP SYSTEM USING THE IMAGE PICK-UP DEVICE

(75) Inventor: Hideki Dobashi, Tokyo (JP)

(73) Assignee: Canon Kabushiki Kaishi, Tokyo (JP)

( * ) Notice: Subject to any disclaimer, the term of this patent is extended or adjusted under 35 U.S.C. 154(b) by 205 days.

(21) Appl. No.: 10/939,508

(22) Filed: Sep. 14, 2004

(65) Prior Publication Data
US 2005/0072906 A1   Apr. 7, 2005

(30) Foreign Application Priority Data
Oct. 2, 2003   (JP) .............................. 2003-344488

(51) Int. Cl.
*H01L 27/00* (2006.01)
(52) U.S. Cl. .................................. 250/208.1; 250/239
(58) Field of Classification Search ............. 250/208.1, 250/239, 214.1
See application file for complete search history.

(56) References Cited

U.S. PATENT DOCUMENTS 4,721,999 A * 1/1988 Takemura et al. .......... 348/276
6,259,083 B1   7/2001 Kimura ................... 250/208.1

FOREIGN PATENT DOCUMENTS

| JP | 8-321595 | 12/1996 |
| JP | 11-68074 | 3/1999 |

* cited by examiner

*Primary Examiner*—Que T. Le
(74) *Attorney, Agent, or Firm*—Fitzpatrick, Cella, Harper & Scinto

(57) ABSTRACT

Receiving a subject image at good sensitivity by improving the light collection efficiency of incident light, wherein an image pick-up element includes a light-receiving portion, poly-silicon wiring formed on the light-receiving portion, and a well structure. The poly-silicon wiring is arranged so as to be overlapped with at least a part of the light-receiving portion, and is electrically connected to the light-receiving portion to perform the control of electric charges generated at the light-receiving portion, the switching of the light-receiving portion, and the like. The well structure is formed in at least a part of the area of the light-receiving portion in which the poly-silicon wiring is arranged, and the opened area of the well structure is sufficiently secured.

7 Claims, 10 Drawing Sheets

IMAGE PICK-UP DEVICE HAVING WELL STRUCTURE AND IMAGE PICK-UP SYSTEM USING THE IMAGE PICK-UP DEVICE

BACKGROUND OF THE INVENTION

1. Field of the Invention

The present invention relates to an image pick-up device and an image pick-up system for picking up a subject image, and more particularly to an image pick-up element having poly-silicon wiring arranged on a light-receiving portion thereof.

2. Description of Related Art

As a conventional image pick-up element for introducing incident light into a light-receiving portion efficiently for performing a photoelectric conversion, for example, as disclosed in Japanese Patent Application Laid-Open No. H8-321595, a structure including an inter-layer lens in addition to a microlens as shown in FIG. 11 has been proposed. An image pick-up element 101 of FIG. 11 includes a light-receiving portion 102 formed in a silicon wafer 110, a microlens 109 for collecting incident light, a high refractive index portion 108, which is provided at a lower layer of the microlens 109 and has a refractive index higher than that of the microlens 109, and a low refractive index portion 107, which is provided at a lower layer of the high refractive index portion 108 and has a refractive index lower than that of the high refractive index portion 108. An inter-layer lens to be convex toward the center of the light-receiving portion 102 is configured at an interface between the high refractive index portion 108 and the low refractive index portion 107. In the image pick-up element 101 having such a configuration, incident light is first refracted toward the center of the light-receiving portion 102 when the incident light enters the microlens 109, and then the incident light is refracted at the interface between the microlens 109 and the high refractive index portion 108. Furthermore, the incident light is collected by the inter-layer lens, and then enters the light-receiving portion 102. By the use of the inter-layer lens, the incident light which cannot be taken in only by the microlens 109 enters the light-receiving portion 102.

For further improving a light collection efficiency, for example, Japanese Patent Application Laid-Open No. H11-68074 proposes an image pick-up element using a well structure. The well structure is a structure including a dug portion dug in the shape of a well in the bottom portion (shown by a dotted line) of the inter-layer lens configured at the interface between a high refractive index portion 208 and a low refractive index portion 207, as shown in FIG. 12. By means of such a well structure 221, incident light is totally reflected on an inner wall of the dug portion, namely the interface between the high refractive index portion 208 and the low refractive index portion 207, and then the incident light enters a light-receiving portion 202. Consequently, the light collection efficiency is further improved.

Generally, poly-silicon wiring made of poly-silicon (poly-crystal silicon) is arranged on the light-receiving portion of an image pick-up element for performing the switching of the light-receiving portion, the control of electric charges, and the like. An image pick-up element 301 of FIG. 13 includes poly-silicon wiring 305 arranged on a light-receiving portion 302.

The image pick-up element 301 includes the light-receiving portion 302 on a silicon wafer 310, a microlens 309 having an optical axis of the center line L1 passing through the center of the light-receiving portion 302 in an X-direction, a well structure 321 composed of a high refractive index portion 308 and a low refractive index portion 307, a tapered portion 322 for guiding incident light into the well tapered portion 322 for guiding incident light into the well structure 321, and the poly-silicon wiring 305 formed on the light-receiving portion 302. The poly-silicon wiring 305 is arranged to overlap on at least a part of the light-receiving portion 302, and is electrically connected with the light-receiving portion 302. The poly-silicon wiring 305 is positioned at the side of the well structure 321 lest the poly-silicon wiring 305 interferes with the potential well structure 321. Pieces of metal wiring 306a and 306b for supplying power source or for controlling electric charges generated by the light-receiving portion 302 by the photoelectric conversion of the incident light are positioned on both the sides of the well structure 321 to put the well structure 321 between the pieces of the metal wiring 306a and 306b above the poly-silicon wiring 305. The pieces of the metal wiring 306a and 306b are severally made of, for example, an aluminum material, and have a light blocking effect. Moreover, both the pieces of the metal wiring 306a and 306b have the same height from the light-receiving portion 2 (in a Z-direction), and are arranged in parallel with each other in a Y-direction.

FIG. 14 is a top view for illustrating a positional relation between the respective pieces of wiring formed in the image pick-up element 301. A letter L2 denotes a center line perpendicular to the center line L1 in FIG. 13 in the Y-direction. As shown in the drawing, the light-receiving portion 302 is formed in an area having a distance of a in the Y-direction and a distance of b in the X-direction (in an area of a×b), and the center in the X-direction is positioned on the center line L2. A distance c being the interval between the pieces of the metal wiring 306a and 306b is formed to be smaller than the distance b. Moreover, the shortest distance between the poly-silicon wiring 305 and the center line L2 is c/2 to coincide with the distance and 306b has the light blocking effect, the substantially functioning part of the light-receiving portion 302 is an area of a×c. The well structure 321 is formed in the area of a×c in order to meet with the substantially functioning part of the light-receiving portion 302.

It is confirmed as to the image pick-up element using the well structure that, when the frontage thereof is too small, it is impossible to take in sufficient incident light, and that the light collection efficiency thereof scarcely differs from that in the case where no well structure is provided, substantially. On the other hand, the image pick-up element has been desired to be miniaturized furthermore in recent years. A problem in which the size of the frontage of the well structure cannot be sufficiently secured when an image pick-up element is tried to be miniaturized has been generated.

SUMMARY OF THE INVENTION

It is an object of the present invention to provide an image pick-up device and an image pick-up system for receiving the light from a subject image at good sensitivity by improving the light collection efficiency of incident light.

For solving the problem described above, an image pick-up device of the present invention is an image pick-up device including a plurality of image pick-up elements each equipped with a light-receiving portion, poly-silicon wiring arranged on the light-receiving portion so as to be over-lapped with at least a part of the light-receiving portion for controlling electric charges, and a well structure introducing incident light into the light-receiving portion, wherein the well structure is formed in at least a part of an area in which the poly-silicon wiring and the light-receiving portion overlap each other.

According to the present invention, because the well structure is formed not only on the light-receiving potion but also in the area in which the poly-silicon wiring and the light-receiving portion overlap each other, so that the opened area of the well structure is sufficiently secured, the amount of the incident light entering the well structure increases. The incident light reaching the poly-silicon wiring is transmitted through the poly-silicon wiring to reach the light-receiving portion, though a part of the incident light is absorbed by the poly-silicon wiring. As a result, more amount of incident light is received, and then light collection efficiency is improved.

Each of the plurality of image pick-up elements may further comprise a microlens for collecting the incident light toward the light-receiving portion. Thereby, the incident light having a wider angle of view can be collected, and the light collection efficiency is improved. Now, the relative positional relation of the well structure and the microlens may be as follows. For example, in an X-direction perpendicular to an optical axis of the microlens, the poly-silicon wiring may be arranged at one end of the light-receiving portion, and the optical axis of the microlens may be positioned at a center between the poly-silicon wiring and an inner wall of the well structure on a side on which the poly-silicon wiring is not arranged. The optical axis of the microlens may be positioned at a center of the well structure. By changing the arrangement of the microlens in such a way, the features of the image pick-up element change. Which structure should be adopted may be suitably changed according to equipment using the image pick-up element (image pick-up device).

Each of the plurality of image pick-up elements may further comprise a wavelength selection layer for selecting a wavelength of transmitted incident light. In particular, when the wavelength selection layer includes an area for selecting a red color, a green color or a blue color, and when the well structure of an image pick-up element arranged correspondingly to the area for selecting the blue color is not arranged in an area in which the poly-silicon wiring and the light-receiving portion overlap each other, the balance of the amount of the received light of a light-receiving element for receiving each color is kept.

The image pick-up system according to the present invention includes a processing section having processing means for processing an image pick-up device according to the above-mentioned present invention and an output signal from the image pick-up device to generate image data, a recording section for storing the image data, an optical section for forming a subject image on an image surface of the image pick-up device, and a control section for controlling the processing section, the recording section and the optical section.

According to the present invention, the well structure equipped by the image pick-up device is arranged not only on the light-receiving portion but also in the area in which the poly-silicon wiring and the light-receiving portion overlap each other. Thereby the opened area of the well structure is sufficiently secured, and the light collection efficiency of the incident light is improved. Consequently, by means of the image pick-up device and the image pick-up system of the present invention, a subject image can be received at a good sensitivity.

DETAILED DESCRIPTION OF THE PREFERRED EMBODIMENTS

In the following, the preferred embodiments of the present invention will be described with reference to the attached drawings.

(First Embodiment)

Figure 1:
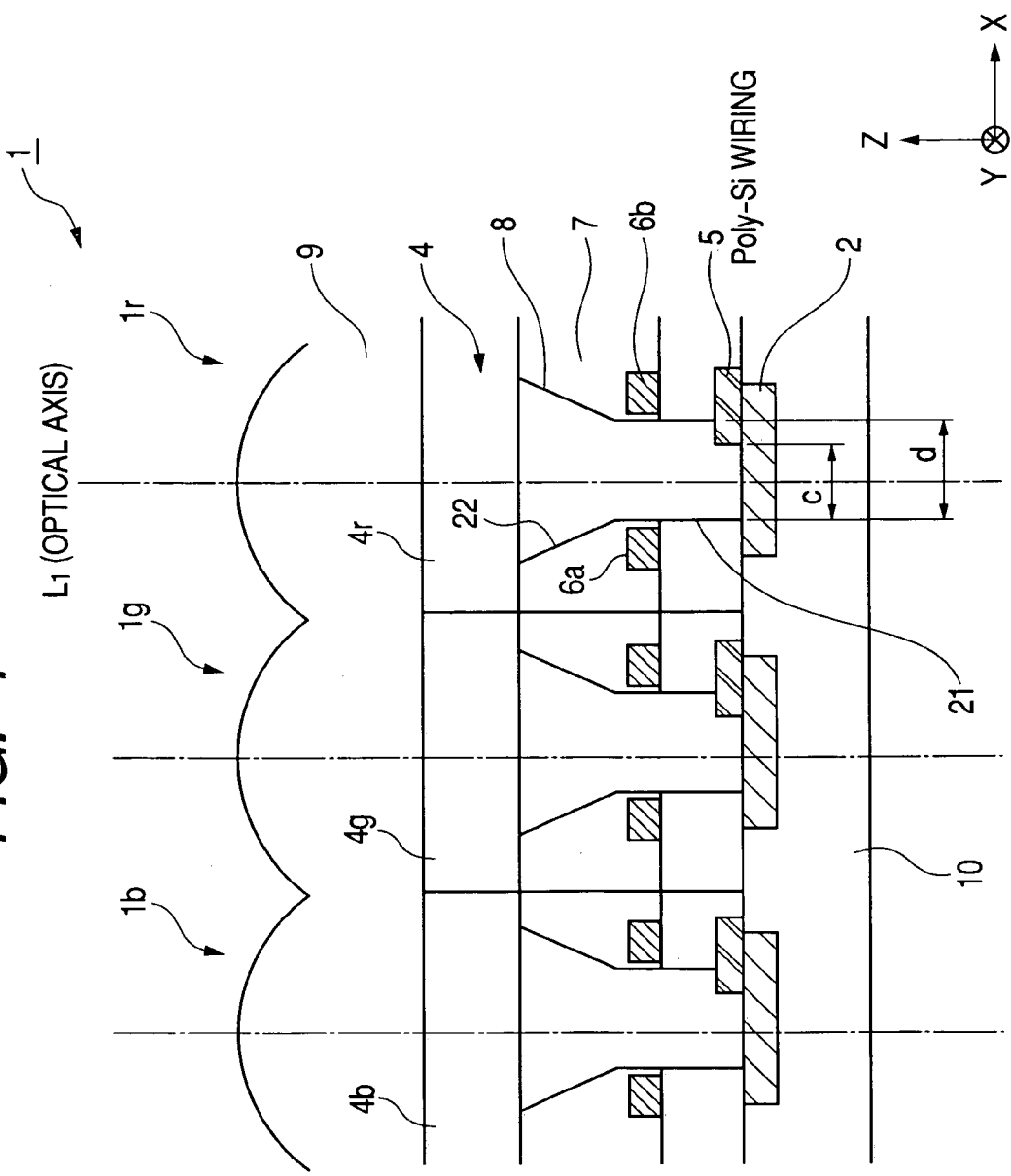
FIG. 1 is a sectional view of an image pick-up device according to a first embodiment of the present invention.

FIG. 1 shows a sectional view of an image pick-up device 1 according to a first embodiment of the present invention. The image pick-up device 1 includes a wavelength selection layer 4 common to each image pick-up element 1r, 1g and 1b as a color filter. Wave selection portions 4r, 4g and 4b are formed in areas of the wavelength selection layer 4 corresponding to the respective image pick-up elements 1r, 1g and 1b. Thus, the image pick-up device 1 is configured in order that each of the image pick-up elements 1r, 1g and 1b can receive read light, green light and blue light, respectively. The image pick-up device 1 is used as, for example, an area sensor of a still video camera. Incidentally, any of the image pick-up elements 1r, 1g and 1b has the same figure, and accordingly the image pick-up element 1r will be described as a representative in the following.

Figure 13:
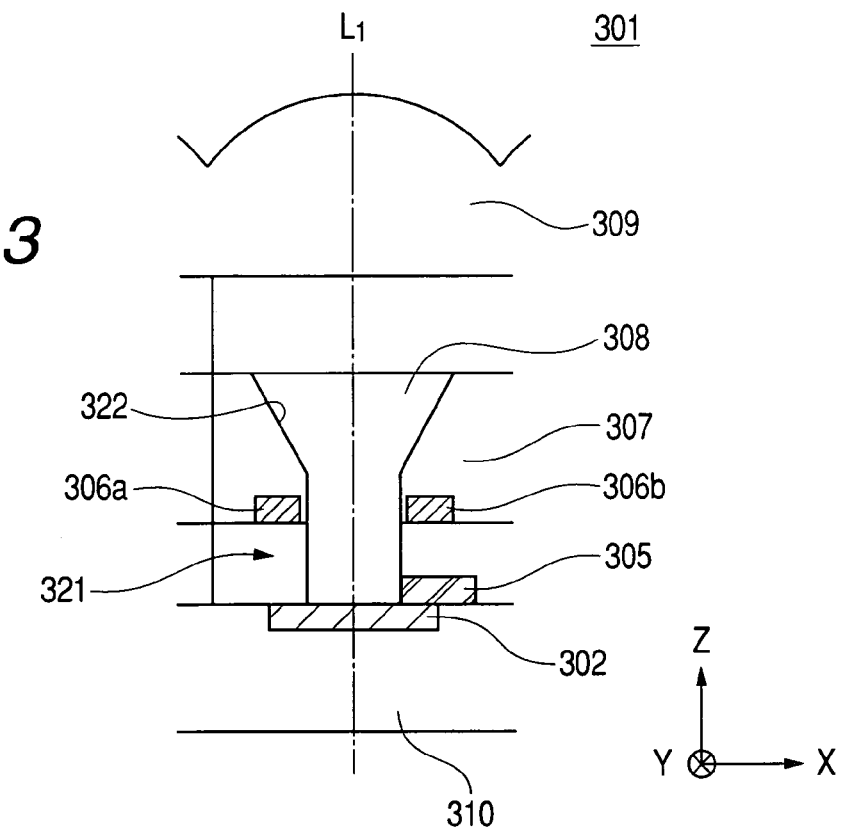
FIG. 13 is a sectional view showing further example of the conventional image pick-up element.

The image pick-up element 1r includes the wavelength selection layer 4 (the wavelength selection portion 4r) arranged at a lower layer of a microlens 9, a well structure 21 and a tapered portion 22, both composed of a high refractive index portion 8 and a low refractive index portion 7, a light-receiving portion 2, which is positioned at a bottom portion of the well structure 21 and is formed in a silicon wafer 10, 1r are the same as those of the image pick-up element 301 of FIG. 13, a part of the same structural portions is omitted to be described.

The microlens 9 has an almost sphere shape convex upward, i.e. toward the incident side of incident light, and has positive lens power. Consequently, the incident light entering the microlens 9 is collected toward the light-receiving portion 2. The microlens 9 may be one formed integrally on the high refractive index portion 8, or may be one formed separately from the image pick-up element 1r to be arranged on the high refractive index portion 8.

The high refractive index portion 8 is made from, for example, titanium dioxide ($TiO_2$, refractive index: 2.5), silicon nitride (SiN, refractive index: 2.0), or the like, and the surface of the high refractive index portion 8 is flattened. On the other hand, the low refractive index portion 7 is made from, for example, silicon dioxide ($SiO_2$, refractive index: 1.46) in consideration of the affinity with silicon (Si) being the material of the silicon wafer 10. It is preferable that the difference between the refractive indices of the high refractive index portion 8 and the low refractive index portion 7 is large as much as possible from the viewpoint of optical characteristics. The poly-silicon wiring 5 is arranged in order to overlap on at least a part of the light-receiving portion 2, and is electrically connected with the light-receiving portion 2 similarly in the image pick-up element 301 of FIG. 13. Moreover, the poly-silicon wiring 5 is formed to be a thin film, and has transparency to incident light. The arrangement position of the poly-silicon wiring 5 is not especially limited, and the poly-silicon wiring 5 is provided at one end of the light-receiving portion 2 in the X-direction in the present embodiment.

Figure 2:
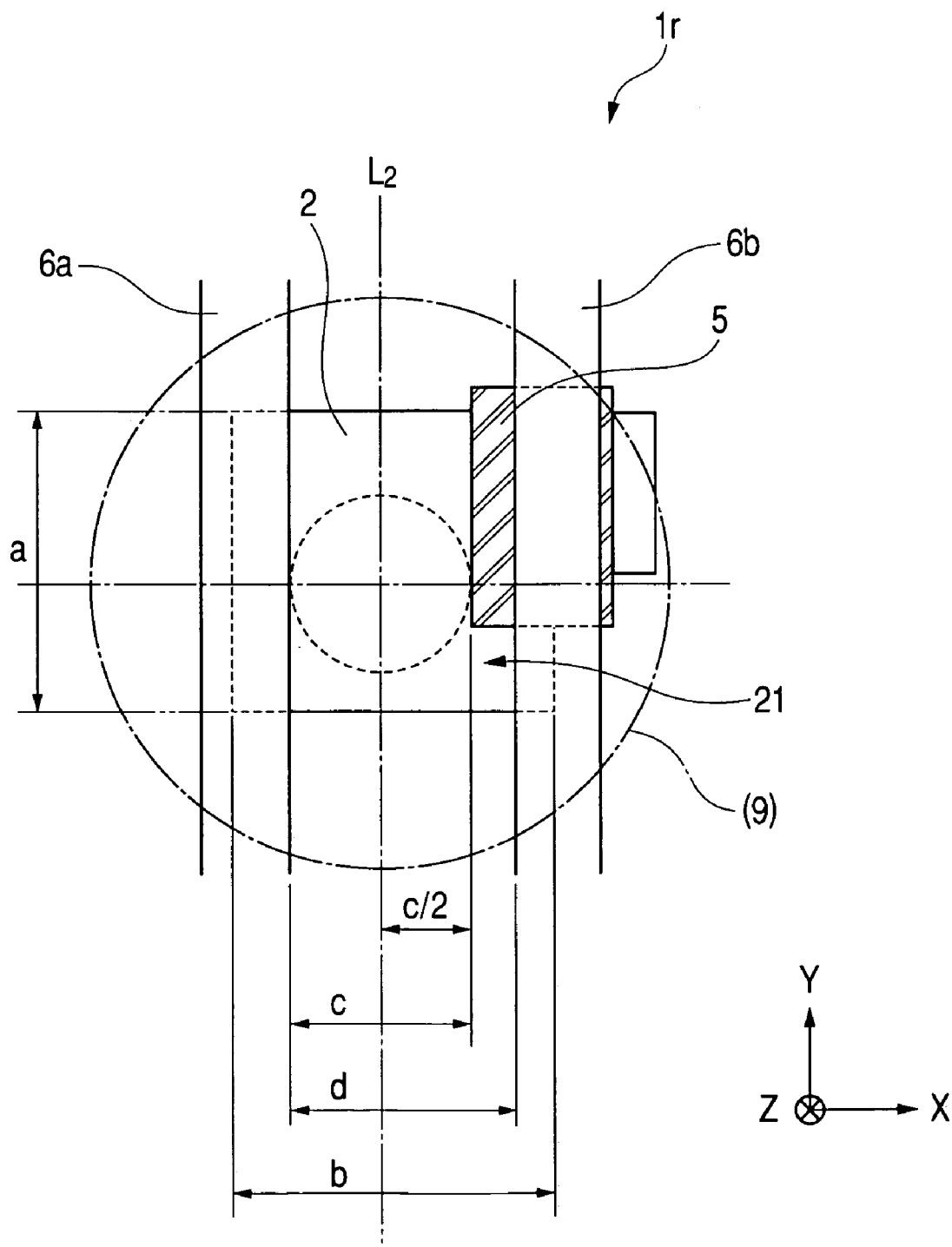
FIG. 2 is a top view for illustrating a positional relation of each wiring of the image pick-up device shown in FIG. 1.

FIG. 2 is a top view for illustrating a positional relation between the respective pieces of wiring formed in the image pick-up element 1r. A letter L2 denotes a center line perpendicular to the center line L1 in FIG. 1 in the Y-direction.

Figure 14:
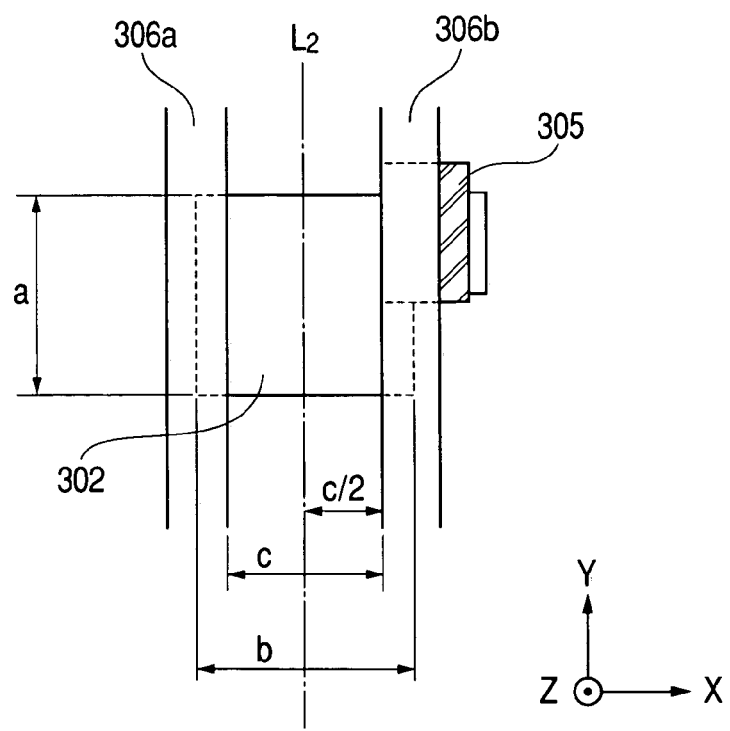
FIG. 14 is a top view for illustrating a positional relation between each piece of wiring of the image pick-up element of FIG. 13.

As shown in FIG. 2, the metal wiring 6b on the side on which the poly-silicon wiring 5 is arranged is provided in order that the distance between the metal wiring 6b and the center line L2 may be longer than that in the configuration of the image pick-up element 301 of FIG. 14. That is to say, the image pick-up element 1r of the present embodiment is configured by shifting the metal wiring 306b of the image pick-up element 301 by a distance (d–c) in the X-direction, and by providing the light-receiving portion 2, the metal wiring 6a and the poly-silicon wiring 5 in the same positional relations as those of the image pick-up element 301.

As shown in FIGS. 1 and 2, the well structure 21 is widened into the X-direction correspondingly to the amount of the shift of the metal wiring 6b. That is to say, the dug portion of the well structure 21 is formed to have a rectangular cross section in an area of a×d being larger than the area of a×c of the image pick-up element 301 of FIG. 14. The well structure 21 is formed on at least a part of the area of the light-receiving portion 2 on which the poly-silicon wiring 5 is arranged.

The tapered portion 22 formed to have the opened area becoming larger as a position thereof becomes higher is provided on the entire circumference of the opened portion at the upper end of the dug portion of the well structure 21. The tapered portion 22 is configured in order that incident light reflected in the tapered portion 22 is introduced into the well structure 21.

Because the well structure 21 is arranged in order that the well structure 21 may be positioned on at least a part of the area of the light-receiving portion 2 on which the poly-silicon wiring 5 is arranged in the image pick-up element 1r configured as described above, the opened area of the well structure 21 is large, and incident light is collected more efficiently. Incidentally, the detailed light collection behavior of the image pick-up element 1r will be described later together with the description of an image pick-up element according to a second embodiment, which will be described later.

(Second Embodiment)

The image pick-up device 1 of the first embodiment is configured so that the optical axis (the center line L1) of the microlens 9 is positioned at the center between the poly-silicon wiring 5 and the inner wall of the well structure 21 on the side on which the poly-silicon wiring 5 is not formed as a result. However, the arrangement of the microlens is not limited to that one, and the characteristics of an image pick-up element can be changed by changing the arrangement of the microlens to the well structure.

Figure 3:
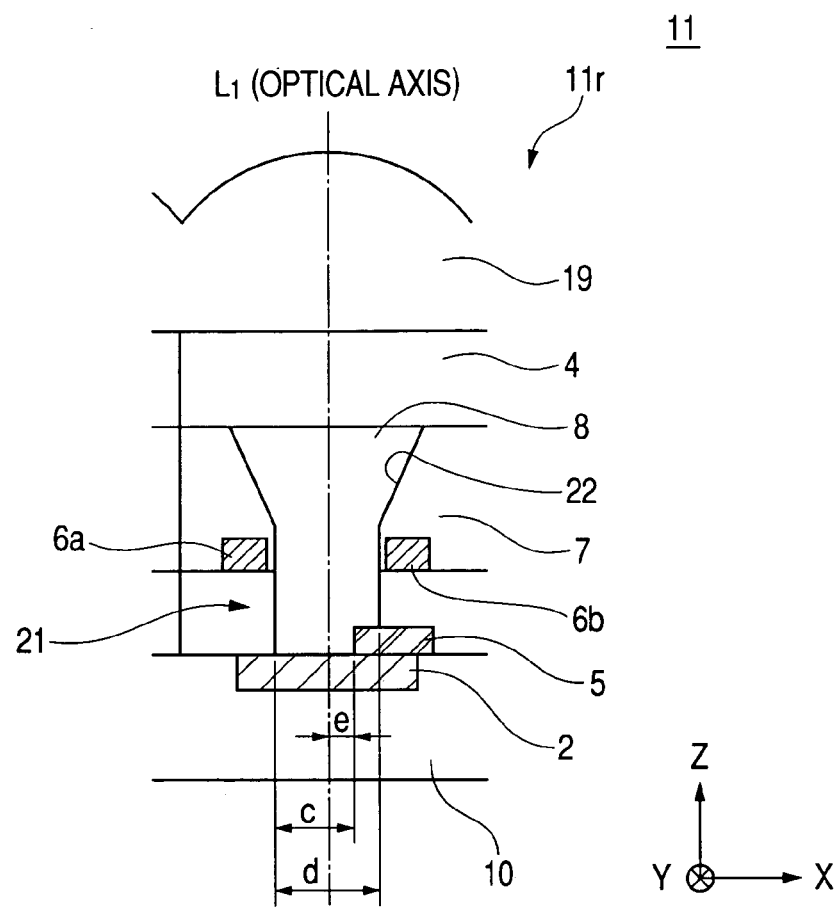
FIG. 3 is a sectional view of an image pick-up device according to a second embodiment of the present invention, and shows an image pick-up element in the image pick-up device.
Figure 4:
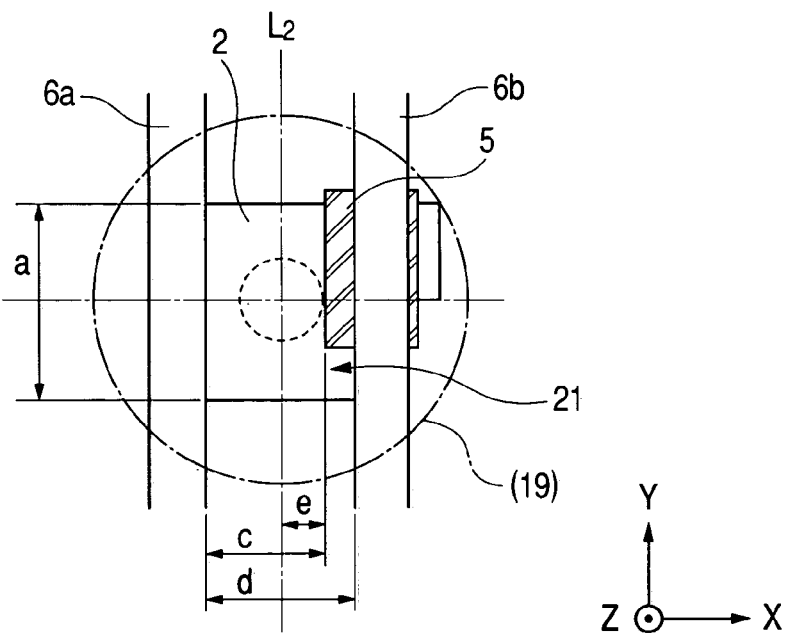
FIG. 4 is a top view for illustrating a positional relation of each wiring of the image pick-up element of FIG. 3.

FIG. 3 shows an example of the image pick-up element according to a second embodiment. FIG. 4 is a top view for illustrating the positional relations among each piece of wiring of the image pick-up element of FIG. 3. An image pick-up element 11r shown in FIGS. 3 and 4 is the same in the structural portions other than a microlens 19 as those of the image pick-up element 1r of FIGS. 1 and 2. The same structural portions are denoted by the same marks as those of FIGS. 1 and 2, and the description of them is omitted.

The microlens 19 is arranged in order that the optical axis (the center line L1) of the microlens 19 may be positioned at the center of the well structure 21 in the X-direction. That is to say, the distances between the center line L1 and the pieces of metal wiring 6a and 6b are severally d/2. Moreover, the minimum distance between the center line L1 and the poly-silicon wiring 5 is indicated by a distance e smaller than the distance c/2.

Figure 5:
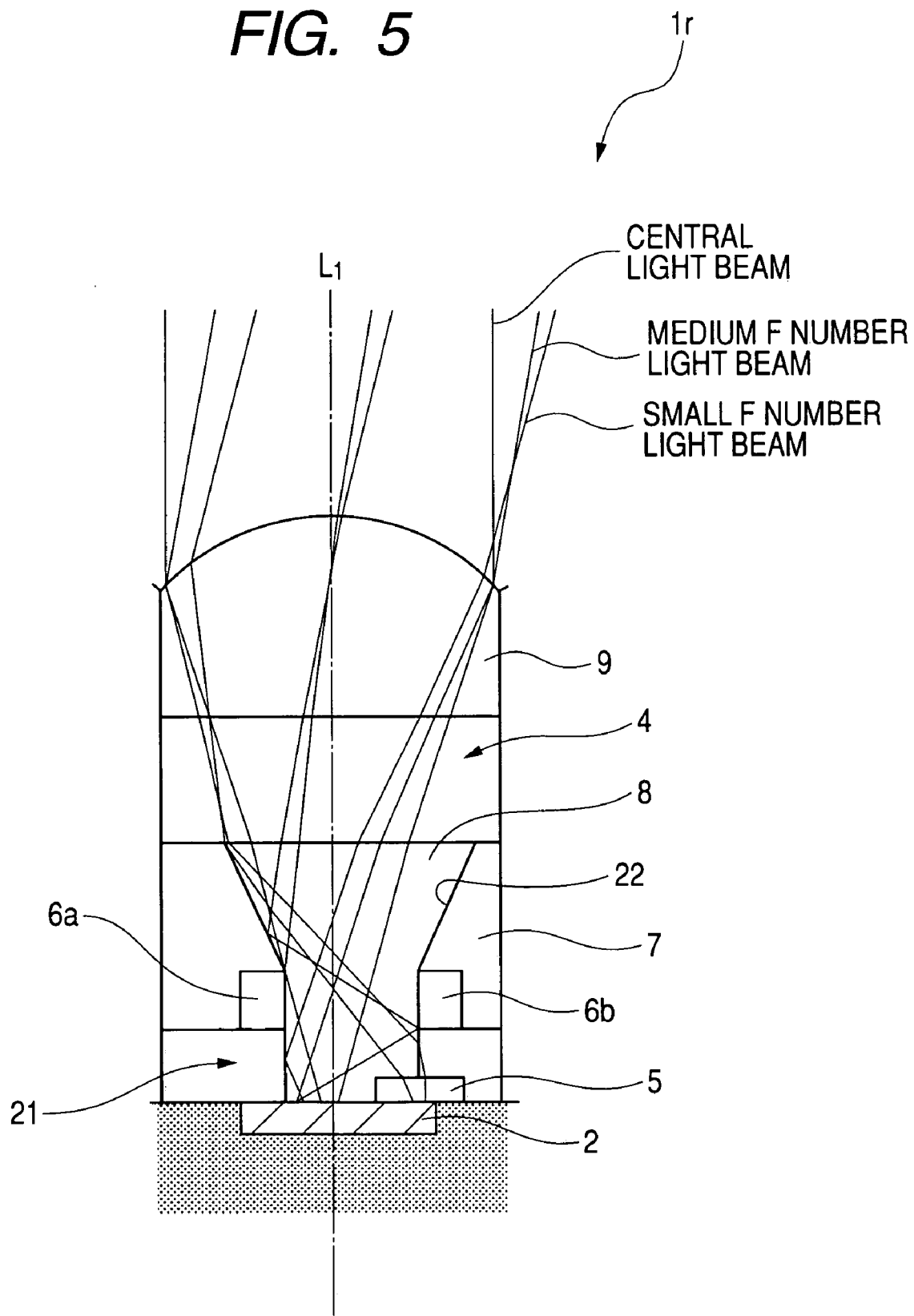
FIG. 5 is a view showing a light collection behavior of an image pick-up element of the image pick-up device of FIG. 1.
Figure 6:
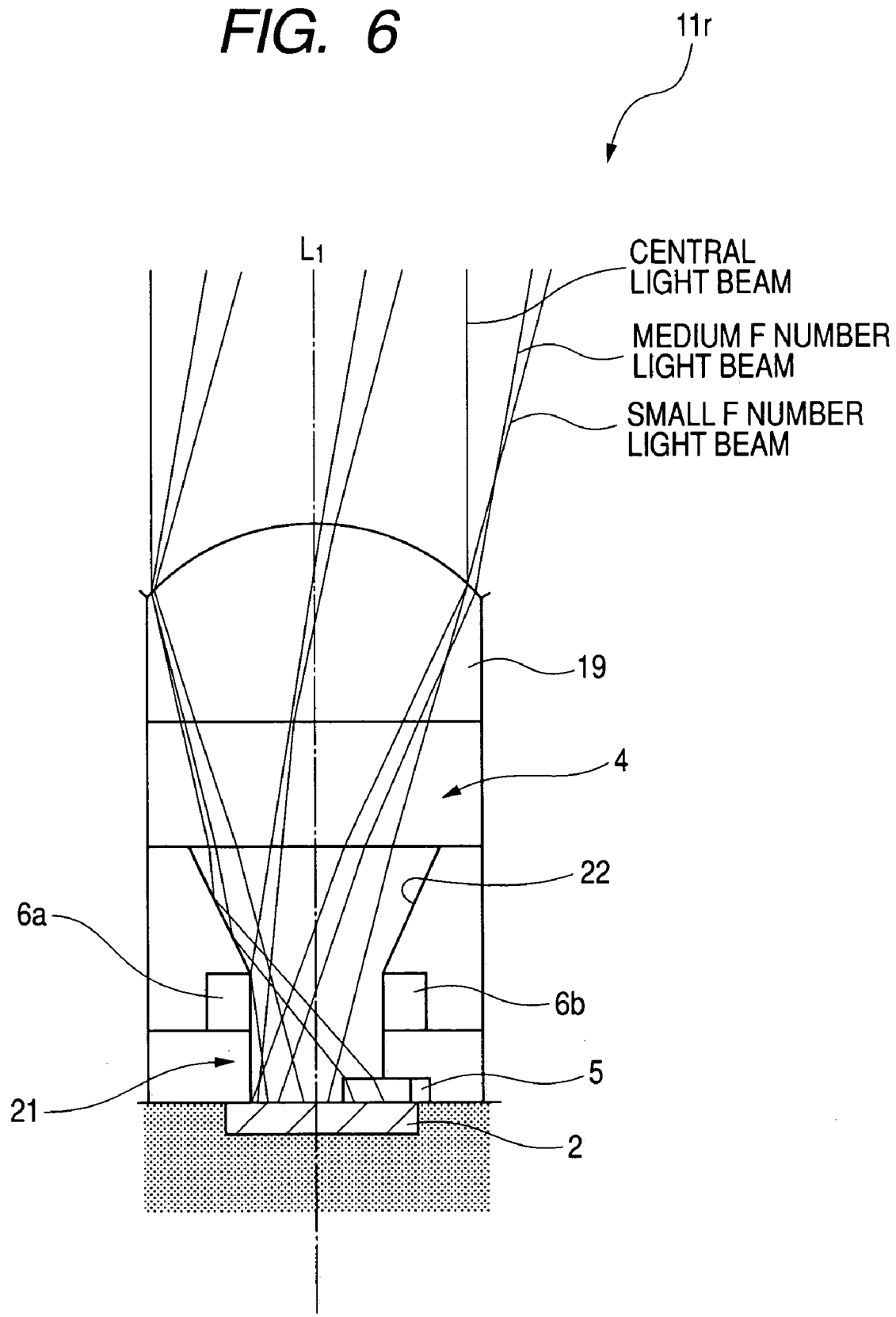
FIG. 6 is a view showing a light collection behavior of the image pick-up element of FIG. 3.

The light collection behavior and the characteristics of the image pick-up elements 1r and 11r of the first and the second embodiments are described in the following with reference to the drawings. FIGS. 5 and 6 show light collection behavior of the image pick-up elements 1r and 11r, respectively.

FIGS. 5 and 6 show the light collection behavior of the central light beam entering the microlens 9 in the optical axis direction thereof, and show the light collection behavior of two light beams having different F numbers from each other. The two light beams having the different F numbers are indicated as a "medium F number light beam" and a "small F number light beam", and these light beams enter the microlens 9 with inclinations to the center line L1.

In any one of the image pick-up elements 1r and 11r, the incident light reaching the poly-silicon wiring 5 is transmitted through the poly-silicon wiring 5 to reach the light-receiving portion 2, though a part of the incident light is absorbed by the poly-silicon wiring 5. Consequently, the image pick-up elements 1r and 11r can receive incident light more efficiently in comparison with, for example, the conventional image pick-up element 301 shown in FIG. 13. Moreover, because the image pick-up elements 1r and 11r are configured to have a large opened area severally, incident light entering obliquely such as the small F number light beam can be easily received.

Figure 7:
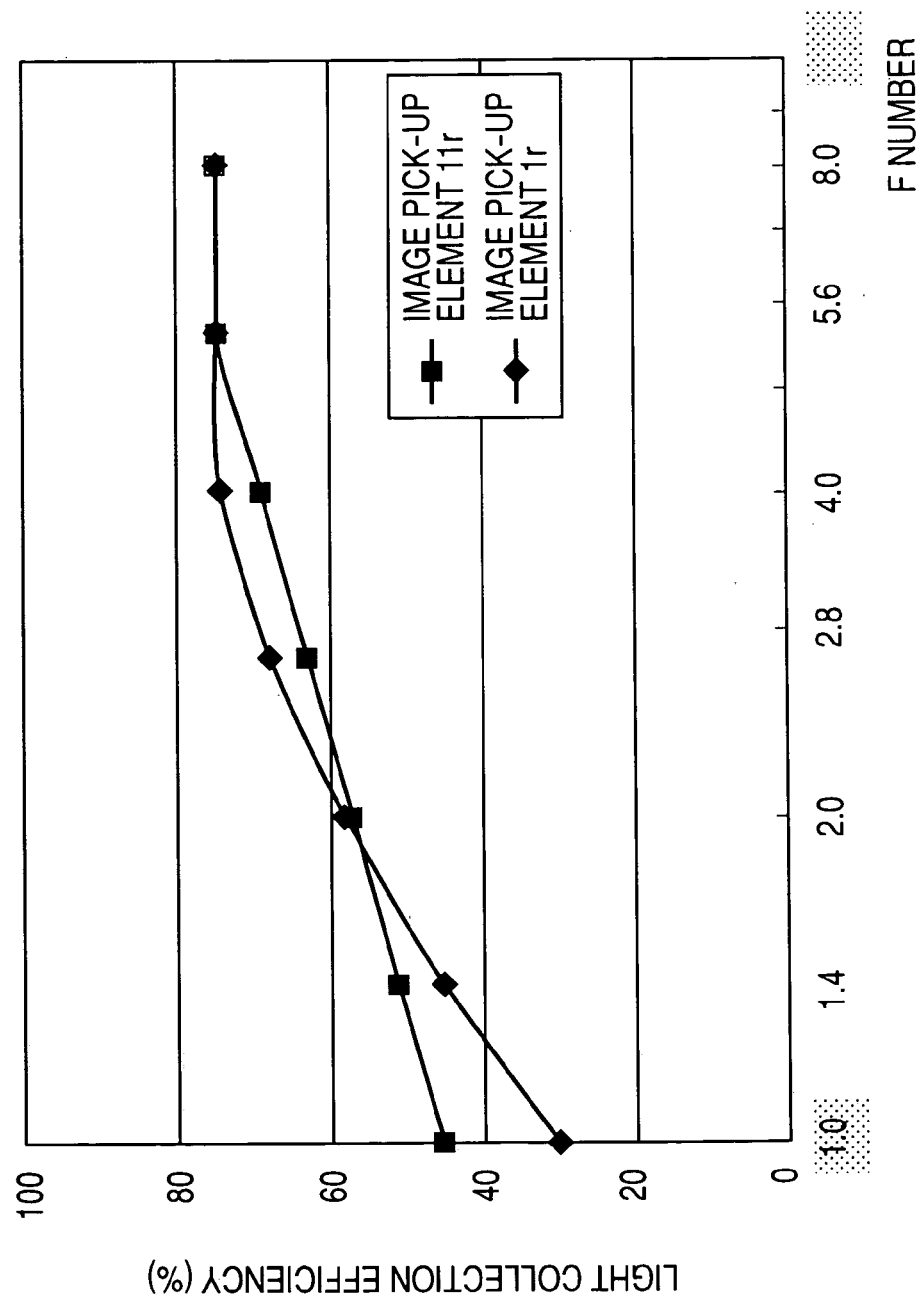
FIG. 7 is a diagram showing characteristics of light collection efficiency corresponding to F numbers of both the image pick-up elements of FIGS. 1 and 3.

FIG. 7 shows characteristics of light collection efficiency of the image pick-up elements 1r and 11r corresponding to F numbers. As shown in the drawings, the light collection efficiency of each of the image pick-up elements 1r and 11r intersects with each other at F2.0. In a section of a range from F1.0 to F2.0, the image pick-up element 11r (see FIG. 3) exhibits higher efficiency. In a section of a range from F2.0 to F5.6, the image pick-up element 1r (see FIG. 1) exhibits higher efficiency. In a section of a range of F numbers equal to F5.6 or more, any one of the image pick-up devices 1r and 11r has fixed light collection efficiency, and exhibits almost the same characteristics. That is to say, as a result, the image pick-up element 1r is superior in the range of the F numbers smaller than F2.0, and the image pick-up element 11r is superior in the range of the F numbers larger than F2.0. Moreover, the image pick-up element 11r has a smaller range of the changes of light collection efficiency corresponding to the changes of the F numbers in comparison with that of the image pick-up element 1r. Accordingly, it is preferable to use the image pick-up elements 1r and 11r selectively according to the characteristics of equipment to be used.

Incidentally, the image pick-up elements 1r and 11r described with regard to the first and the second embodiments exhibit the effects of the present invention even if the image pick-up elements 1r and 11r are arranged at any positions in the image pick-up device 1 and 11 to be used as area sensors, respectively. For example, the image pick-up elements 1r and 11r may be severally arranged at a position near to the center of a screen on the optical axis of a lens (not shown), or may be severally arranged at the peripheral parts of the screen distant from the optical axis. Because the well structure is originally for receiving incident light efficiently, it is effective to use the image pick-up elements equipped with the well structures at the peripheral parts of a screen. Moreover, because the opened areas of the well structures of the above-mentioned image pick-up elements 1r and 11r are sufficiently secured, the image pick-up elements 1r and 11r can be more suitably used at the peripheral parts of a screen, and the images picked up by means of the image pick-up elements 1r and 11r have small differences in light quantities at the centers and at the peripheral parts.

(Third Embodiment)

Figure 8:
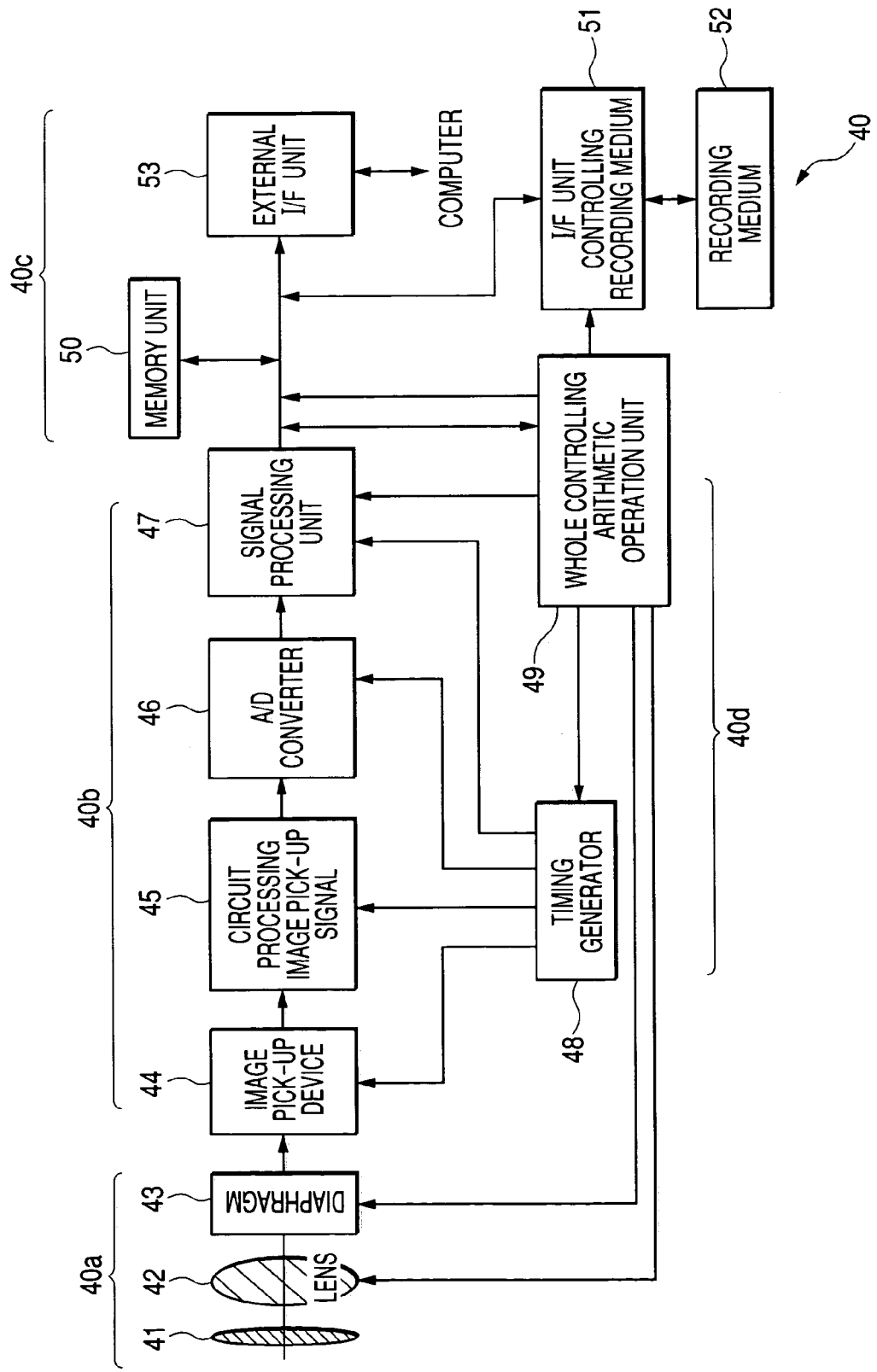
FIG. 8 is a block diagram of an embodiment of an image pick-up system using an image pick-up device according to one embodiment of the present invention.

FIG. 8 is a block diagram of an embodiment of an image pick-up system using an image pick-up device according to the embodiments of the present invention described above.

An image pick-up system 40 shown in FIG. 8 is an image pick-up system such as a still video camera. When the image pick-up system 40 is roughly divided, the image pick-up system 40 is composed of an optical section 40a for forming an image, a processing section 40b for performing the photoelectric conversion of the formed image and for processing the signal obtained by the photoelectric conversion, a recording section 40c for performing the recording and the like of the data worked and processed by the processing section 40b, and a control section 40d for controlling the drive of each section.

The optical section 40a is composed of a lens 42 for forming an optical image of a subject image on an image surface, a barrier 41 used as a protection of the lens 42 and also used as a main switch, and a diaphragm 43 for changing the amount of light.

The processing section 40b is composed of an image pick-up device 44 (e.g. the image pick-up device 1 of FIG. 1) according to the present invention, which image pick-up device 44 is arranged on an image surface as an area sensor, a circuit processing an image pick-up signal 45 for performing processing such as the correction and the clamping of a signal obtained by the image pick-up device 44, an A/D converter 46 for performing the analog-digital conversion of a signal output from the circuit processing an image pick-up signal 45, and a signal processing unit 47 for performing the correction and the compression of the data output from the A/D converter 46.

The recording section 40c is composed of a memory unit 50 for temporarily storing final data obtained by the processing of the signal processing unit 47, an interface unit for controlling a recording medium 51, to which a predetermined recording medium 52 such as a semiconductor memory is detachably connected, for performing the recording and the reading of data against the recording medium 52, and an external interface unit 53 for performing the communication with an external computer or the like.

The control section 40d for controlling each section is equipped with a timing generator 48 for outputting timing signals to the image pick-up device 44, the circuit processing an image pick-up signal 45, the A/D converter 46 and the signal processing unit 47, and a whole controlling arithmetic operation unit 49 for controlling the timing generator 48. The whole controlling arithmetic operation unit whole 49 is also configured to be capable of performing the drive control of each unit of the lens 42, the diaphragm 43, the signal processing unit 47 and the recording section 40c.

The operation of the image pick-up system 40 configured as described above is described in the following.

When the barrier 41 is opened, the main power source is turned on. Next, the power source of the control system is turned on. Furthermore, the power source of the image pick-up system circuits such as the A/D converter 46 is turned on. The whole controlling arithmetic operation unit 49 releases the diaphragm 43. The image pick-up device 44 performs the photoelectric conversion of the incident light entering from the lens 42, and output a signal. The signal output from the image pick-up device 44 passes through the circuit processing an image pick-up signal 5, and is output to the A/D converter 46. The A/D converter 46 performs the A/D conversion of the signal to output the converted signal to the signal processing unit 47. The signal processing unit 47 performs the arithmetic operation of an exposure on the basis of the data under a control by the whole control arithmetic operation unit. According to the result of the arithmetic operation, the whole control arithmetic operation unit 49 controls the diaphragm 43.

Next, the signal processing unit 47 extracts high frequency components on the basis of the signal output from the image pick-up device 44, and the whole control arithmetic operation unit 49 performs the arithmetic operation of the distance from the image pick-up system 40 to a subject image. The whole control arithmetic operation unit controlling the whole 49 drives the lens 42 on the basis of the distance obtained by the arithmetic operation, and judges whether to be focused or not. When the whole control arithmetic operation unit 49 judges that the lens 42 is not focused, the whole control arithmetic operation unit 49 again drives the lens 42 and performs distance measuring.

When a focused state is confirmed by repeating the above-mentioned processes, the image pick-up system 40 begins an actual exposure. When the exposure has been completed, an image signal output from the image pick-up device 44 receives a correction or the like in the circuit processing image pick-up signal 45, and furthermore the corrected image signal receives A/D conversion in the A/D converter 46. Then the converted digital data passes through the signal processing unit 47 to be stored in the memory unit 50 by the whole control arithmetic operation unit 49. The data thus stored in the memory unit 50 is recorded in the recording medium 52 through the interface unit controlling a recording medium 51 by the whole control arithmetic operation unit 49. Alternatively, the data stored in the memory unit 50 can be directly output to a computer or the like connected to the external interface unit 53 through the external interface unit 53.

In the image pick-up system 40 described above, because the image pick-up device 44 of one embodiment of the present invention is used, subject images can be picked up at good sensitivities.

Figure 9:
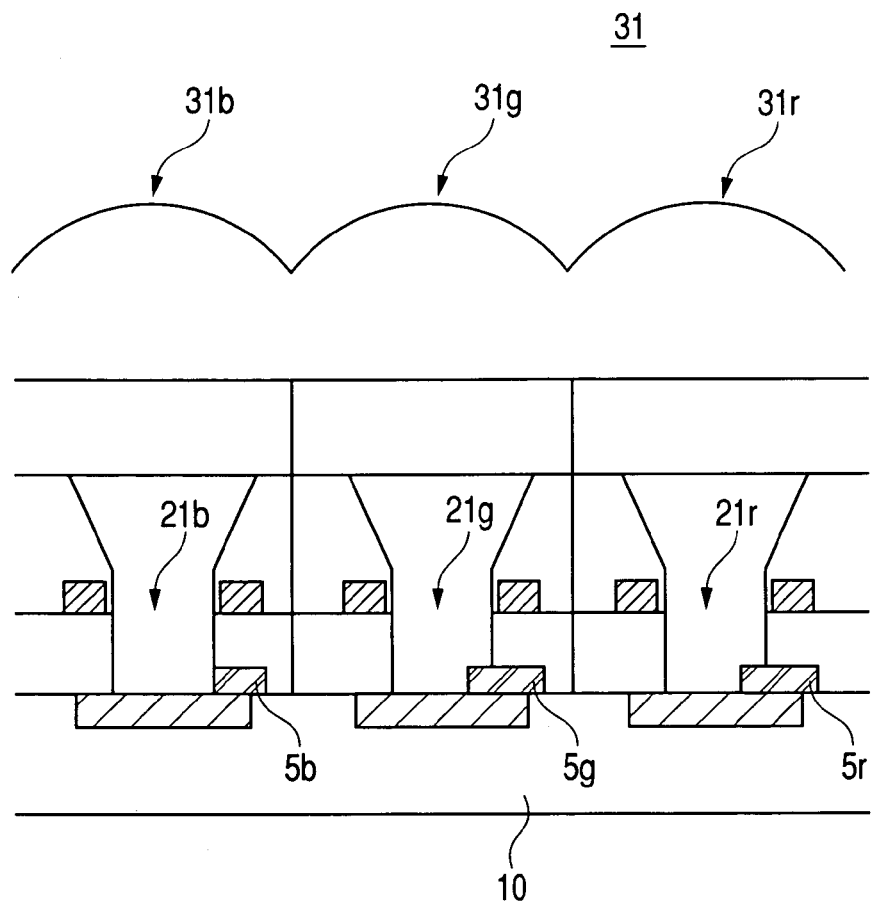
FIG. 9 is a sectional view of an image pick-up device made of only the image pick-up elements corresponding to a green color and a red color in accordance with one embodiment of the present invention.

Although the embodiments described above have the image pick-up devices in which respective image pick-up elements all have the same shape, the image pick-up devices are not limited to such ones. For example, the image pick-up devices may be changed to an image pick-up device 31 shown in FIG. 9. Image pick-up elements 31r, 31g and 31b of the image pick-up device 31 are equipped with well structures 21r, 21g and 21b and poly-silicon wiring 5r, 5g and 5b, respectively. The well structures 21r and 21g among the well structures 21r, 21g and 21b are formed to be positioned above the poly-silicon wiring 5r and 5g similarly to those in the image pick-up device 1 of FIG. 1. That is to say, in the image pick-up device 31, only the image pick-up elements 31r and 31g are configured similarly to the embodiments described above, and the image pick-up element 31b is configured to be the same as the conventional form. The thus configured image pick-up device 31 has the following characteristics.

Poly-silicon wiring formed on a thin film generally has a characteristic of absorbing incident light, but the transparency of the poly-silicon wiring is not so high. Consequently, several percents to several tens percents of the incident light reaching the poly-silicon wiring are absorbed by the poly-silicon wiring. The degree of the absorption remarkably depends on the thickness or the like of the poly-silicon wiring, and especially the wavelength of a blue color in the incident light is easy to absorb. Accordingly, in case of an image pick-up device receiving a red color, a green color and a blue color, only the image pick-up element 31b receiving the blue color is configured in the conventional form as the image pick-up device 31, and thereby the balance among the amounts of the received light by the image pick-up element 31r, 31g and 31b can be kept. That is to say, because the incident light having a small angle of view is not eclipsed in the image pick-up element 31b and the light collection efficiencies of the image pick-up elements 31r and 31g are improved, the effects of the well structures can be sufficiently brought out. Incidentally, it is preferable to perform the change in consideration of the shape of the poly-silicon wiring, the F number of the equipment using and the image pick-up device, and the like.

Figure 10:
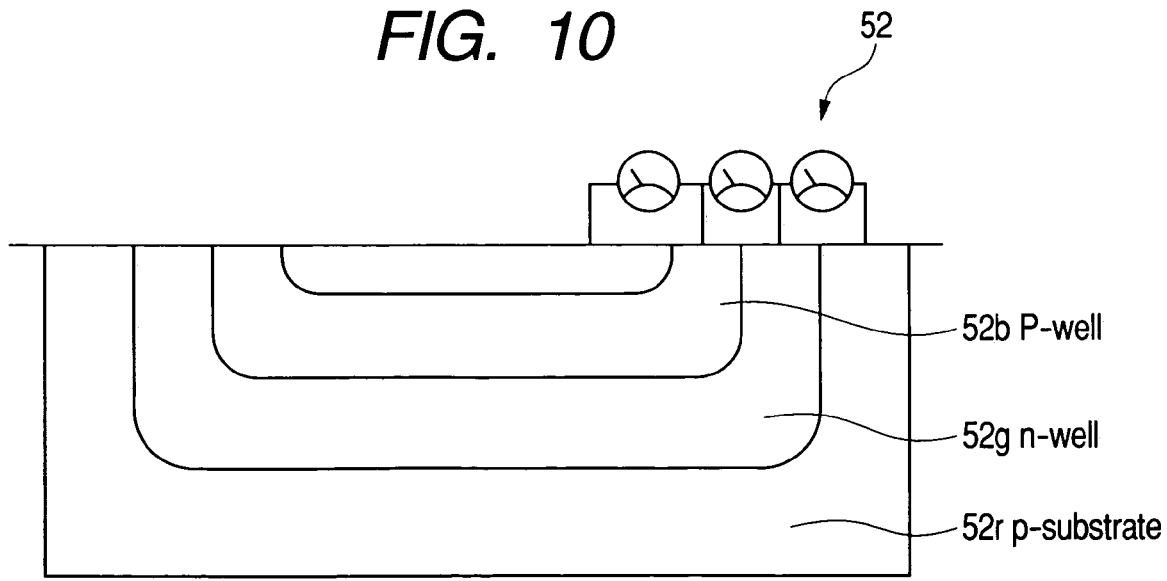
FIG. 10 is a sectional view showing an example of a photoelectric conversion element which does not need any wavelength selection layers.
Figure 11:
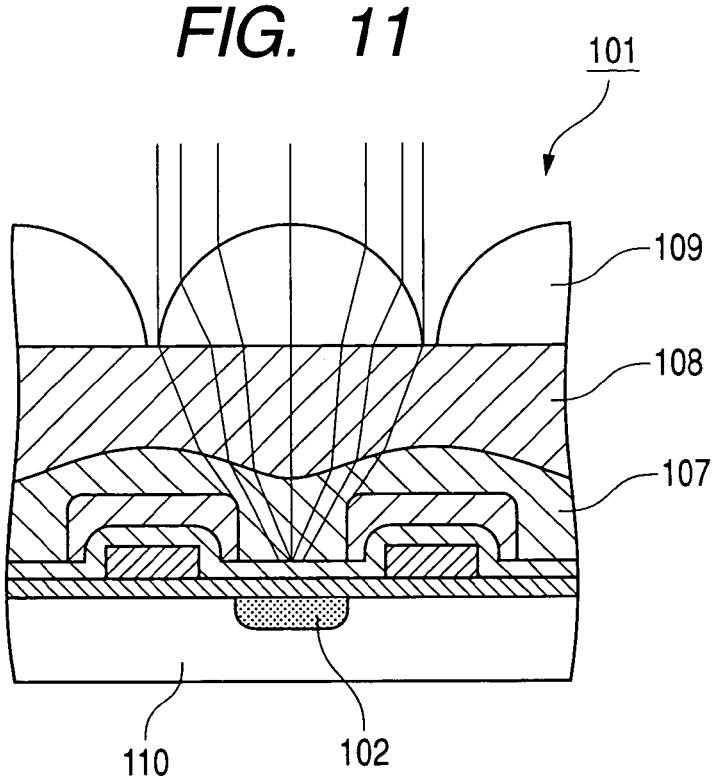
FIG. 11 is a sectional view showing an example of the conventional image pick-up element.
Figure 12:
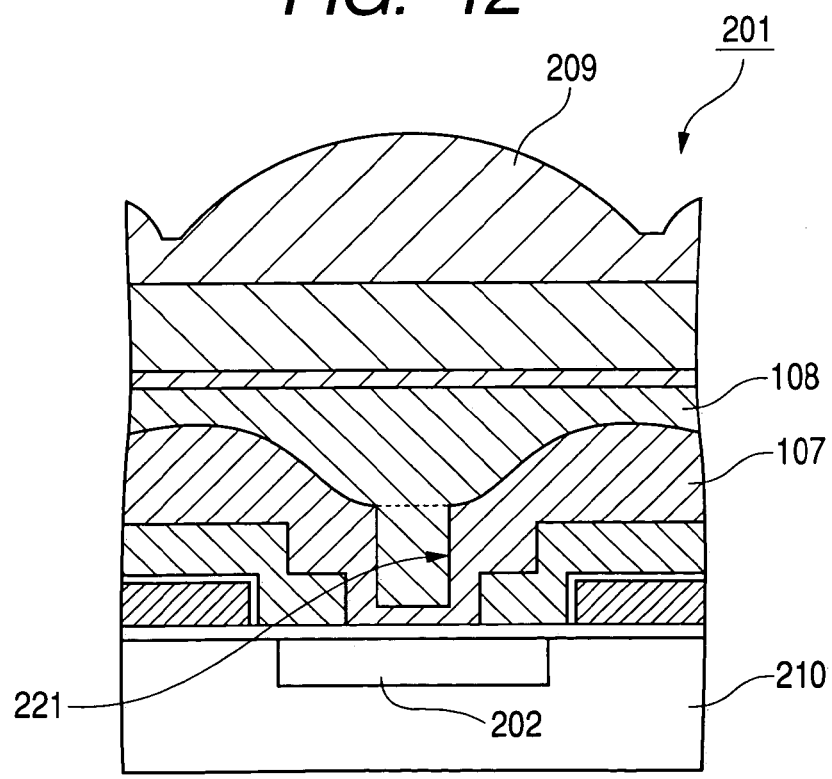
FIG. 12 is a sectional view showing another example of the conventional image pick-up element.

In the above-mentioned embodiments, the image pick-up device provided with the wavelength selection layer (color filters) is exemplified to be described, but no wavelength selection layers are necessary in case of using a photoelectric conversion device shown in FIG. 10. The photoelectric conversion device 52 of FIG. 10 is a device in which a p-well 52b, an n-well 52g and a p-substrate 52r are formed in layers in the depth direction of a silicon wafer for performing the selection of wavelengths and photoelectric conversion at the same time. Incidentally, it is of course that no wavelength selection layers are necessary also in case of obtaining a monochrome image.

In the above, typical embodiments are described, but components described in each embodiment may be used in arbitrary combinations as much as possible.

This application claims priority from Japanese Patent Application No. 2003-344488 filed Oct. 2, 2003, which is hereby incorporated by reference herein.

What is claimed is:

1. An image pick-up device including a plurality of image pick-up elements each equipped with a light-receiving portion, poly-silicon wiring arranged on said light-receiving portion so as to be overlapped with at least a part of said light-receiving portion for controlling electric charges, and a well structure introducing incident light into said light-receiving portion, wherein
said well structure is formed in at least a part of an area in which said poly-silicon wiring and said light-receiving portion overlap each other.

2. An image pick-up device according to claim 1, wherein each of said plurality of image pick-up elements further comprises a microlens for collecting the incident light toward said light-receiving portion.

3. An image pick-up device according to claim 2, wherein in an X-direction perpendicular to an optical axis of said microlens, said poly-silicon wiring is arranged at one end of said light-receiving portion, and the optical axis of said microlens is positioned at a center between said poly-silicon wiring and an inner wall of said well structure on a side on which said poly-silicon wiring is not arranged.

4. An image pick-up device according to claim 2, wherein in an X-direction perpendicular to an optical axis of said microlens, said poly-silicon wiring is arranged at one end of said light-receiving portion, and the optical axis of said microlens is positioned at a center of said well structure.

5. An image pick-up device according to claim 4, wherein each of said plurality of image pick-up elements further comprises a wavelength selection layer for selecting a wavelength of transmitted incident light.

6. An image pick-up device according to claim 5, wherein said wavelength selection layer includes an area for selecting a red color, a green color or a blue color, and said well structure of an image pick-up element arranged correspondingly to said area for selecting the blue color is not arranged in an area in which said poly-silicon wiring and said light-receiving portion overlap each other.

7. An image pick-up system, comprising a processing section including an image pick-up device according to claim 1 processing means for processing an output signal from said image pick-up device to generate image data, a recording section for storing the image data, an optical section for forming a subject image on an image surface of said image pick-up device, and a control section for controlling said processing section, said recording section and said optical section.

* * * * *

UNITED STATES PATENT AND TRADEMARK OFFICE
CERTIFICATE OF CORRECTION

PATENT NO. : 7,135,666 B2
APPLICATION NO. : 10/939508
DATED : November 14, 2006
INVENTOR(S) : Hideki Dobashi It is certified that error appears in the above-identified patent and that said Letters Patent is hereby corrected as shown below:

ON COVER PAGE AT (73) ASSIGNEE

"Canon Kabushiki Kaishi, Tokyo (JP)" should read --Canon Kabushiki Kaisha, Tokyo (JP)--.

COLUMN 4

Line 58, "read light," should read --red light,--.

COLUMN 5

Line 4, "wafer 10, 1r" should read --wafer 10, poly-silicon wiring 5 arranged on the light-receiving portion 2, and pieces of metal wiring 6a and 6b, which are positioned above the poly-silicon wiring 5 and severally have a light blocking effect. Incidentally, because the image pick-up element 1r is mainly featured by the shape of the well structure 21 and the other structural portions of the image pick-up element 1r--.

COLUMN 8

Line 22, "whole 49" should read --49--;
Line 35, "output" should read --outputs--; and
Line 37, "signal 5," should read --signal 45,--.

COLUMN 9

Line 51, "using" should read --used--.

COLUMN 10

Line 51, "claim 1" should read --claim 1,--.

Signed and Sealed this
Twenty-eighth Day of December, 2010

David J. Kappos
*Director of the United States Patent and Trademark Office*